United States Patent
Ono et al.

(10) Patent No.: US 6,849,191 B2
(45) Date of Patent: Feb. 1, 2005

(54) METHOD AND APPARATUS FOR TREATING SURFACE OF SEMICONDUCTOR

(75) Inventors: Tetsuo Ono, Iruma (JP); Tatsumi Mizutani, Koganei (JP); Ryouji Hamasaki, Hikari (JP); Tokuo Kure, Tokyo (JP); Takafumi Tokunaga, Iruma (JP); Masayuki Kojima, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/249,292

(22) Filed: Feb. 12, 1999

(65) Prior Publication Data

US 2003/0132198 A1 Jul. 17, 2003

(30) Foreign Application Priority Data

Feb. 13, 1998 (JP) .......................................... 10-030864

(51) Int. Cl.[7] .............................................. H01L 21/00
(52) U.S. Cl. ............................ 216/61; 216/67; 216/72; 438/714; 438/738
(58) Field of Search ............................ 216/61, 67, 72; 438/714, 738; 156/345

(56) References Cited

U.S. PATENT DOCUMENTS

| | | | | |
|---|---|---|---|---|
| 4,579,623 A | * | 4/1986 | Suzuki et al. | 118/50.1 |
| 4,585,516 A | * | 4/1986 | Corn et al. | 156/345.44 |
| 4,808,258 A | * | 2/1989 | Otsubo et al. | 156/345.44 |
| 4,893,166 A | * | 1/1990 | Geekie | 257/516 |
| 5,352,324 A | * | 10/1994 | Gotoh et al. | 156/345.28 |
| 5,614,060 A | * | 3/1997 | Hanawa | 156/345.44 |
| 5,983,828 A | * | 11/1999 | Savas | 118/723 I |
| 6,010,603 A | * | 1/2000 | Ye et al. | 204/192.35 |
| 6,068,784 A | * | 5/2000 | Collins et al. | 216/68 |
| 6,093,332 A | * | 7/2000 | Winneczek et al. | 216/2 |
| 6,129,806 A | * | 10/2000 | Kaji et al. | 156/345 |
| 6,187,685 B1 | * | 2/2001 | Hopkins et al. | 438/710 |

FOREIGN PATENT DOCUMENTS

| | | | | |
|---|---|---|---|---|
| JP | 04054373 A | * | 2/1992 | F16H/61/18 |
| JP | 06085396 A | * | 3/1994 | H01S/3/18 |
| JP | 10030864 A | * | 2/1998 | F25C/1/10 |

* cited by examiner

*Primary Examiner*—Allan Olsen
(74) *Attorney, Agent, or Firm*—Antonelli, Terry, Stout & Kraus, LLP

(57) ABSTRACT

According to the present invention, there is provided a sample surface treating apparatus for processing a fine pattern by plasma etching, including a stage provided in a chamber, on which a sample to be subjected to a surface treatment is placed; etching gas supply source for continuously supplying an etching gas for plasma generation into the chamber; a plasma generator for generating a high-density plasma in the chamber; a bias power supply for applying a bias voltage of 100 kHz or higher to the stage independently of the plasma generation; and a pulse modulator for modulating the bias power supply at a frequency of 100 Hz to 10 kHz, wherein a surface treatment in which the minimum feature size is 1 μm or smaller is performed on the sample placed on the stage.

6 Claims, 9 Drawing Sheets

(a) POINT A  
Vpp=360v (b) POINT B  
Vpp=498v (c) POINT C  
Vpp=630v

INITIAL STATE (a)  AFTER STEP 1 (b)  AFTER STEP 2 (c)  AFTER STEP 3 (d)

METHOD AND APPARATUS FOR TREATING SURFACE OF SEMICONDUCTOR

BACKGROUND OF THE INVENTION

The present invention relates to method and apparatus for treating the surface of a semiconductor and, more particularly, the invention relates to a surface treating method and apparatus for etching the surface of a semiconductor using a plasma.

Hitherto, for treating the surface of a semiconductor, a plasma etcher for etching a semiconductor in a plasma has been used. Conventional techniques will be described by using an etcher, called an ECR (electron cyclotron resonance) etcher, as an example. According to the ECR etcher, a plasma is generated by microwaves within a chamber to which a magnetic field is applied from the outside. The motion of electrons is circular around the magnetic field, and high density plasma is produced by resonance of electron motion and the microwaves. In order to accelerate ions impinging on a sample, such as a semiconductor, a high frequency voltage is applied to the sample. A halogen gas formed from chlorine, fluorine, or the like is used as a plasma gas.

Among conventional etchers of this kind, an etcher for realizing high accuracy during processing is disclosed in Publication of Unexamined Japanese Patent Application (JP-A) No. 6-151360 (corresponding to U.S. Pat. No. 5,352,324). According to this technology, by on-off modulating a high frequency voltage to be applied to the sample, the selectivity between silicon (Si) serving as a substance to be etched and an underlying oxide film can be increased and the aspect ratio dependence can be reduced. JP-A-8-339989 (corresponding to U.S. Pat. No. 5,614,060) discloses a method which can reduce etch residue by overlapping short pulses of a continuous rf bias power in etching performed on a metal. JP-A-62-154734 discloses a method of processing a taper by introducing a gas capable of bringing about deposition and etching and alternately applying a DC bias which is higher than a predetermined potential and a DC bias which is lower than the predetermined potential. JP-A-60-50923 (corresponding to U.S. Pat. No. 4,579,623) discloses a method of improving the surface treating characteristics by periodically varying the amount of etching gas being introduced and also by changing the time of application of the high frequency voltage. Examined Japanese Patent Application Publication No. 4-69415 (corresponding to U.S. Pat. No. 4,808,258) discloses a method of improving the etch characteristic by modulating the high frequency voltage to be applied to a sample. Further, U.S. Pat. No. 4,585,516 discloses a method of improving the uniformity in the etch rate in the plane of a wafer by modulating the high frequency voltage of at least one of high frequency power supplies connected to two electrodes in a triode etcher.

As the integration of a semiconductor becomes finer, the processing dimension between a line corresponding to a conductive line or an electrode and a space enters a region of 1 $\mu$m or smaller, preferably, 0.5 $\mu$m or smaller. In the processing of such a fine pattern, a problem occurs in that lines gradually become thicker and a pattern cannot be formed according to a design dimension. Further, in addition to an aspect ratio dependent etch rate, an aspect ratio dependent etch profile becomes conspicuous, thereby hindering the processing.

Moreover, the thickness of a gate oxide film of a MOS (metal oxide semiconductor) transistor is equal to or smaller than 6 nm in a 256 Mbit or larger LSI (Large Scale Integration). In such devices, the degree of anisotropy and the selectivity between a material to be etched and the underlying oxide film have the relation of a trade-off, so that the processing is made more difficult.

Many of the conventional techniques were developed when the minimum feature size of a device was 1 $\mu$m or larger. It is becoming difficult to use these techniques to process a device of finer scale. In processing such a fine scale device, it is necessary to set accurate process parameters based on an analysis of the relation between plasma parameters and etch characteristics. At present, many manufactures expend a considerable effort on this determination. By such an organized process, a new device which is qualitatively different also can be processed.

SUMMARY OF THE INVENTION

It is an object of the invention to provide a method and apparatus for treating the surface of a semiconductor, which can process a device whose processing dimension is 1 $\mu$m or smaller, preferably, 0.5 $\mu$m or smaller, so as to respond to the need for producing a finer scale semiconductor.

A feature of the invention relates to a surface treating apparatus comprising: a stage provided in a chamber, on which a sample to be subjected to a surface treatment is placed; etching gas supplying means for continuously supplying an etching gas for plasma generation into the chamber; plasma generating means for generating a high density plasma in the chamber; a bias power supply for applying a bias voltage of 100 kHz or higher frequency to the stage independently of the plasma generation; and a pulse modulating method for modulating the bias power supply with a frequency of 100 HZ to 10 kHz, wherein a surface treatment in which the minimum feature size is 1 $\mu$m or smaller is performed on the sample placed on the stage.

Another feature of the invention relates to a sample surface treating method of applying a radio frequency (rf) bias to the sample and time-modulating the rf bias when a sample, having a gate electrode on $SiO_2$ serving as an underlying film, whose thickness is 6 nm or smaller, is etched by using a plasma.

Another feature of the invention relates to a method of treating the surface of a sample by continuously supplying an etching gas into a chamber, generating a high density plasma in the chamber, and applying an rf bias voltage to the stage independently of the plasma generation, wherein a surface treatment in which the minimum feature size is 1 $\mu$m or smaller is performed on the sample placed on the stage by using a mixed gas of chlorine and oxygen as the etching gas, and on-off modulating the bias power supply.

According to the invention, in the processing of a fine pattern, an rf voltage to be applied to a sample is on-off modulated, and a combination of the frequency of the rf voltage and the on-off frequency is devised, thereby increasing the degree of anisotropy of etching and also increasing the etch selectivity. Thus, the processing of a device whose processing size is 1 $\mu$m or smaller, preferably, 0.5 $\mu$m or smaller, can be realized. Specifically, by the narrow band of an ion energy distribution, the trade-off between the anisotropy and the selectivity as a problem in processing a fine device is solved.

DETAILED DESCRIPTION OF PREFERRED EMBODIMENTS

Figure 1:
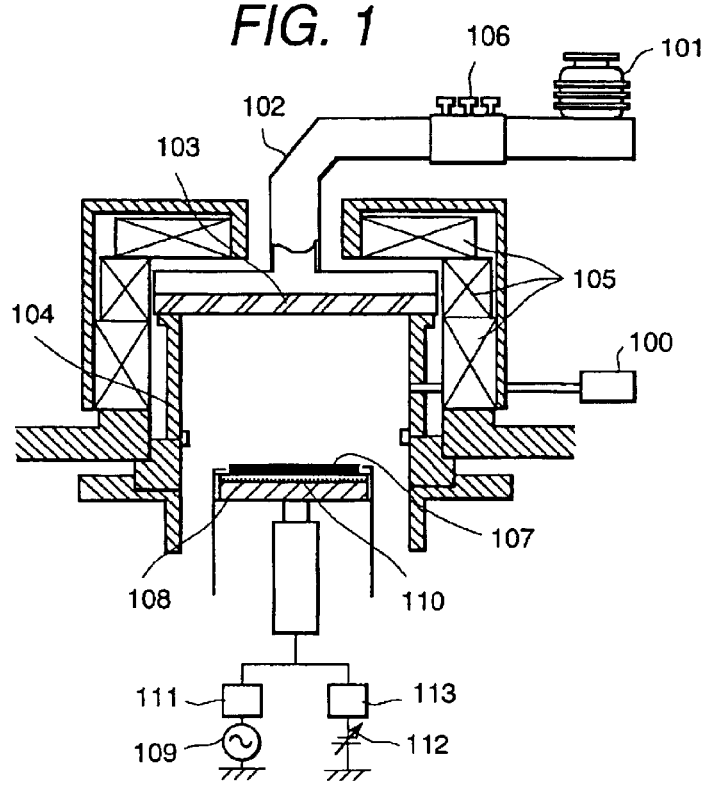
FIG. 1 is an axial sectional view showing the overall configuration of an etcher according to an embodiment of the invention.

Embodiments of the present invention will be described hereinbelow with reference to the drawings. A first embodiment of the invention will be described with reference to FIGS. 1 and 2. FIG. 1 is a diagram showing the overall configuration of a plasma etcher to which the invention is applied. Microwaves are introduced from a magnetron 101 via an automatic matching apparatus 106, a waveguide 102, and a transparent window 103 into a chamber 104. Meanwhile, an etching gas, such as a halogen gas, is introduced into the chamber 104 via a gas introducing device 100 and a plasma of the gas is generated in association with the introduction of the microwaves. The transparent window 103 is made of a material, such as quartz and ceramics, which transmit microwaves (electromagnetic waves).

Around the chamber 104, coils 105 are arranged. The magnetic flux density of the coils 105 is set so as to resonate with the frequency of the microwaves. For example, when the frequency is 2.45 GHz, the magnetic flux density is 875 Gauss. With this magnetic flux density, the cyclotron motion of electrons in the plasma resonates with the frequency of the electromagnetic waves, so that the energy of the microwaves is efficiently supplied to the plasma. Thus, a high density plasma can be produced.

A sample 107 is placed on a stage 108. In order to accelerate ions impinging on the sample 107, an rf (radio frequency) bias power supply 109 serving as an rf power supply is connected to the stage 108 via a high-pass filter 111. An insulating film 110, such as a ceramic or polymer film, is formed on the surface of the stage 108. A DC power supply 112 is also connected to the stage 108 via a low-pass filter 113, whereby a voltage is applied to the stage 108, thereby holding the sample on the stage by an electrostatic chuck action.

Figure 2:
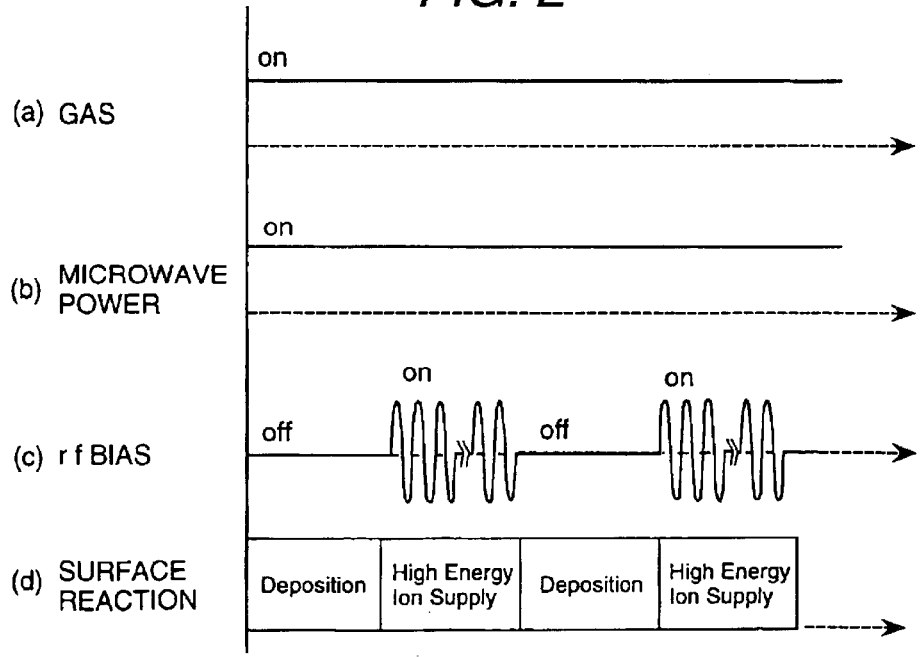
FIG. 2 is a diagram showing the operation timing at the time of etching by the etcher of FIG. 1.

FIG. 2 shows the gas supply in the chamber 104 and the operations of the magnetron 101 and the rf bias power supply 109 at the time of etching by the etcher of FIG. 1. As shown in line (a), a gas is supplied and the gas pressure is kept constant upon start of the etching. As shown in line (b), the microwave power is also continuously supplied. On the other hand, as shown in line (c), the rf bias applied to the sample is periodically on-off modulated. By generating ion accelerating periods and un-accelerated periods using the on-off modulation of the rf bias, periods in which the ion energy is high and periods in which the ion energy is low are produced during the time of the sample surface treatment. As shown in line (d), in the low energy ion period, the etching does not develop. Rather, reaction products in the gas or plasma are deposited.

Figure 3:
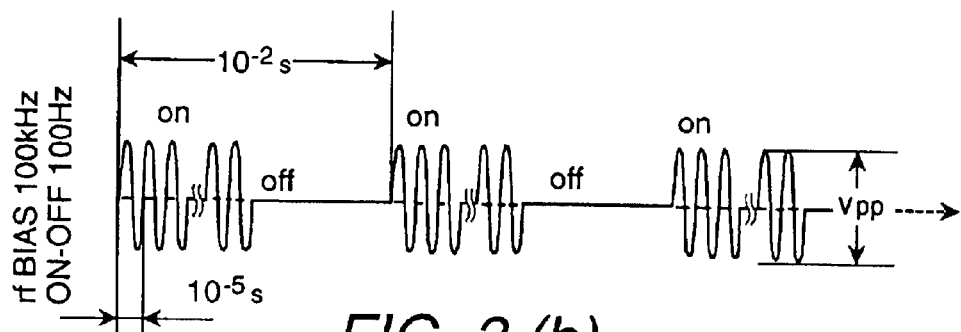
FIGS. 3(a) and 3(b) are waveform timing diagrams showing the relation between an rf bias frequency and an on off frequency in the etcher of FIG. 1.
Figure 3:
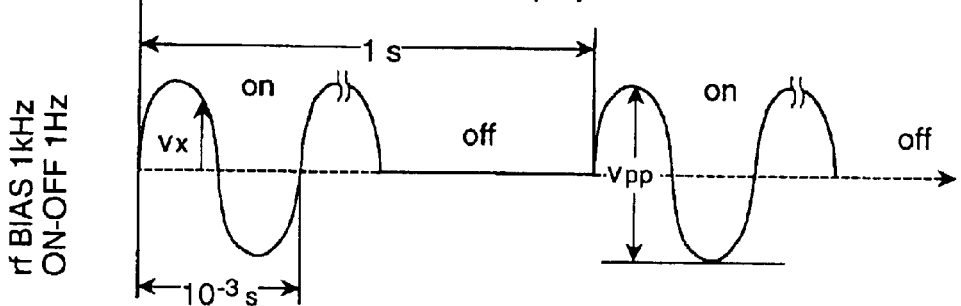

The relation among the frequency of the rf bias, the on-off frequency, and the etch characteristic will now be described. FIG. 3(a), which shows waveforms of the rf biases, corresponds to the etch parameters of the present embodiment and shows the waveform when the rf bias frequency is 100 kHz and the on-off frequency (modulating frequency) is 100 Hz. FIG. 3(b) shows the waveform when the rf bias frequency is 1 kHz and the on-off frequency (modulating frequency) is 1 Hz, as known from the publication of Unexamined Japanese Patent Application No. 6-151360 (corresponding to U.S. Pat. No. 5,352,324).

When the rf bias is applied to the stage, a region (called a "sheath") of a high electric field is produced in a region of almost 1 $\mu$m or smaller in the thickness direction from the surface of the sample, and ions are accelerated in the sheath. The distribution of the energy of the accelerated ions depends on the rf bias frequency. When the rf bias frequency is sufficiently low, the motion of the ions follows a change in the voltage expressed by a sine wave, so that the ions have the same energy as an instantaneous value Vx (FIG. 3(b)) of the voltage. The energy distribution becomes very wide as shown by the 1 kHz characteristic in FIG. 4.

When the frequency of the rf bias becomes high, the motion of the ions cannot follow the fluctuation in the rf bias. Consequently, the energy of the ions gradually converges on the value of a DC component Vdc of a voltage generated at the time of application of the rf bias. There is a transient state during this period. When the frequency lies in a range from about 100 kHz to a few MHz, as shown by the 100 kHz characteristic in FIG. 4, the energy of the ions has a saddle-shaped distribution including a peak 401 of high energy corresponding to the peak to peak amplitude Vpp of the rf bias and a peak 402 of low energy. The peak 402 of low energy corresponds to ions which enter the sheath when the rf bias is 0 W, that is, just at a timing when the ions are not accelerated due to a fluctuation in the rf bias.

Figure 4:
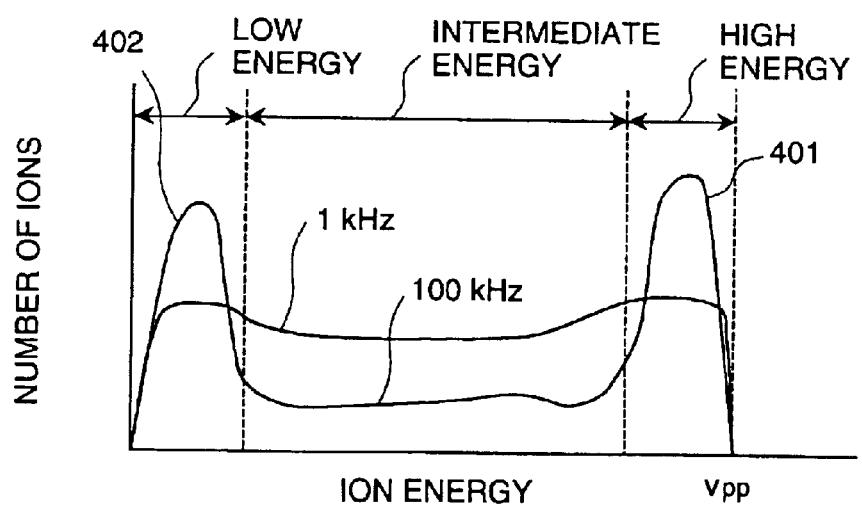
FIG. 4 is a diagram showing ion energy distribution.

The ions are not accelerated in the period during which the rf bias is off, and all of the ions enter a region corresponding to the low energy peak 402 in FIG. 4 at that time.

Figure 5:
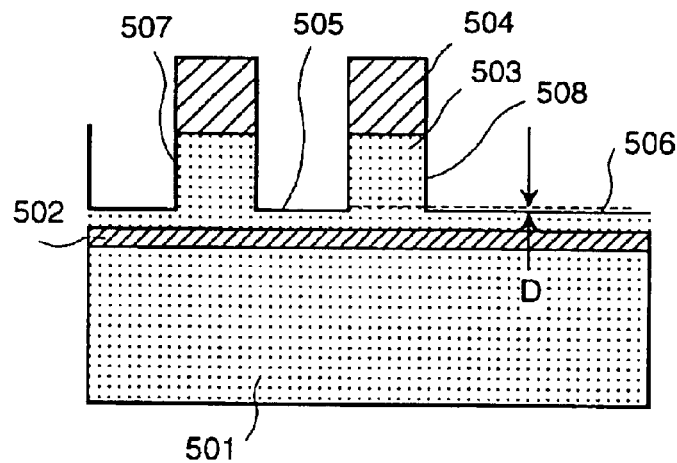
FIG. 5 is a cross section of a sample treated by method of the invention.

FIG. 5 shows the result of a case where a fine pattern comprising lines and spaces is etched on the surface of a sample by using the etcher of FIG. 1. A mixed gas of chlorine (72 sccm) and oxygen (8 sccm) was used as an etching gas, and the pressure in the chamber 104 was set to 0.4 Pa. The microwave output from the magnetron 101 was set to 400 W. The structure of the etched semiconductor is as follows. The thickness of a gate oxide film 502 on a silicon substrate 501 is 4 nm, the thickness of a polysilicon film 503 is 300 nm, the thickness of a resist 504 is 1 $\mu$m, the width of each line is 0.4 $\mu$m, and the width of each space is 0.4 $\mu$m. FIG. 5 shows an etch profile obtained when the frequency of the bias power supply 109 was set to 100 kHz and the on-off frequency was set to 100 Hz. The peak output of the rf bias was 300 W and the duty ratio (the ratio of the on periods in a certain cycle) was 20%.

Figure 6:
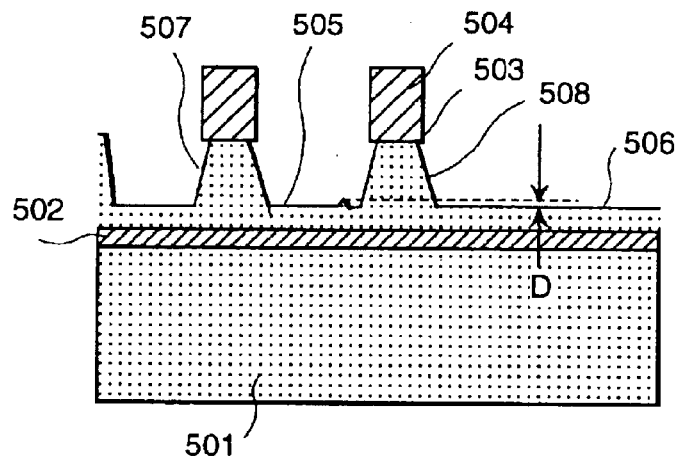
FIG. 6 is a cross section of a sample at the time of treatment in a comparative example.

FIG. 6 shows an etch profile as a comparative example in which the frequency of a bias power supply, which is known from the Examined Japanese Pat. Application Publication 6-151360 (corresponding to U.S. Pat. No. 5,352,324), was set to 1 kHz and the on-off frequency was set to 1 Hz. The peak output of the rf bias was 300 W and the duty ratio was 20%.

Figure 7:
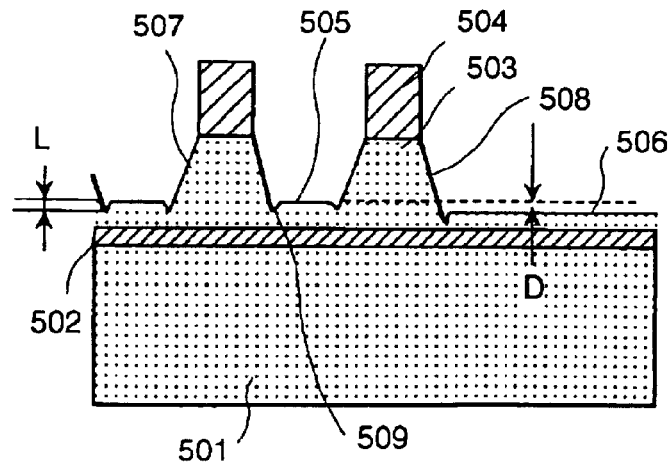
FIG. 7 is a cross section of a sample at the time of treatment in a comparative example.

FIG. 7 is a cross section of a comparative example in which the rf bias frequency was set to 100 kHz and the continuous output power was set to 60 W. With these parameters, the etch rate of the polysilicon film 503 was approximately 250 nm/min. and the selectivity between the polysilicon film and the oxide film was about 20.

FIGS. 5 to 7 show the profiles during the etching of the polysilicon film 503. By the etching (FIG. 5) according to the method of the invention, vertical sidewalls and a flatly etched bottom surface are obtained. There is no aspect ratio dependence, so that the etch depth of a wide part 506 and that of a narrow space 505 are equal.

On the other hand, in case of performing etching with a continuous wave bias (FIG. 7) in the comparative example, the sidewalls are not so vertical. With respect to a sidewall 507 facing a narrow part and a sidewall 508 facing a wide part, the verticality of the latter is worse. A fine trench 509, called a microtrench, is formed on the etched bottom surface. Further, an aspect ratio dependence occurs, and the difference D in the etch depth occurs between the narrow part and the wide part.

Even if the rf bias is on-off modulated, when the rf bias frequency is low (FIG. 6) in the comparative example, although the verticality of the sidewalls is higher than that of the case using the continuous wave bias, undercutting occurs in the resist 504. The verticality is lower than that of the case of FIG. 5 to which the method of the present invention is applied.

The causes of the above results will be explained. In comparison between the on-off modulation of the rf bias (on-off bias or time modulation bias) and the continuous bias application (continuous wave bias), since the energy of the ions for obtaining the same polysilicon etch rate can be set higher by on-off modulating the rf bias, the degree of anisotropy can be improved. For example, the amplitude Vpp when the continuous wave bias is 60 W is 320V and the amplitude Vpp when the on-off bias peak power is 300 W is 1,410V. The energy of the ions is almost proportional to the amplitude Vpp of the bias voltage. Consequently, since the energy of the ions can be increased by the on-off bias as compared with the continuous wave bias, the verticality is improved.

On the other hand, even if continuous wave bias is used, by increasing the amplitude Vpp, the verticality is improved. However, the etch rate of the oxide film becomes higher almost in proportion to the amplitude Vpp, so that the selectivity between the polysilicon film and the oxide film becomes low. Therefore, the etching becomes unsuitable for a case where the underlying oxide film is thin, such as the etching of a gate electrode in a transistor.

That is, regarding the on-off bias, by providing off periods in the acceleration of ions, the number of high energy ions is reduced, so that the verticality can be raised without deteriorating the selectivity. The microtrench is formed when the verticality of the sidewalls becomes lower, ions are reflected from the sidewalls and the bottom surface is bombarded with the ions. When the verticality of the side-walls is improved, the microtrench is also reduced and a flatly etched bottom surface can be obtained.

Even when the rf bias is on-off modulated, if the rf bias frequency is low, a number of ions having an intermediate energy exist as shown in FIG. 4. Consequently, undercutting occurs. To be more specific, the etch reaction is promoted by the impinging of the ions having the energy of a threshold or more. Although ions having an intermediate energy promote the etching reaction, since the energy is low, their directionality is bad. Consequently, the ions impinge on the polysilicon sidewall 503 under the resist 504, thereby causing the undercut.

By setting the rf bias to 100 kHz or higher, as in this embodiment, the number of ions having an intermediate energy can be reduced, so that highly anisotropic etching can be realized. More specifically, in order to raise the degree of anisotropy of the etching, it is necessary to set the energy of the ions so as to have a distribution including high and low peak points. Low ion energy does not contribute to etching and high ion energy has a high directionality. Effects of the on-off modulation of the rf bias prove their real worth for the first time when the rf bias is set to 100 kHz or higher, at which level the ion energy has a distribution including the high and low peak points.

Figure 8:
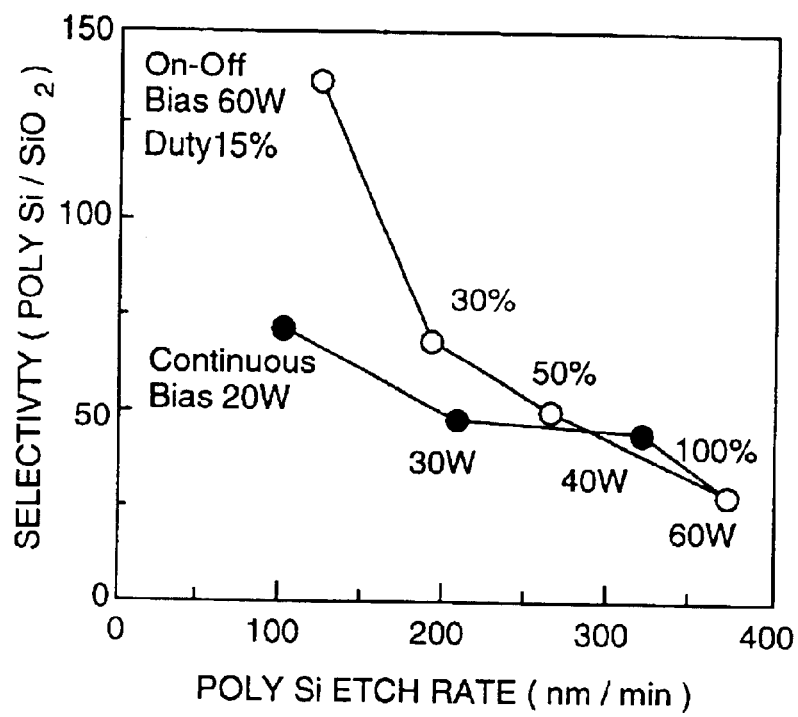
FIG. 8 is a graph showing the relation between a polysilicon etch rate and selectivity.

A second embodiment of the invention will be described. The duty ratio of the on-off rf bias and the ion energy will be described first. FIG. 8 shows the relation between the etch rate of polysilicon and the etch selectivity between the oxide film and the polysilicon film, and the case using a continuous wave bias and a case using an on-off bias are compared with each other. In the example, the output power of the microwaves from the magnetron 101 was set to 400 W, the output power of the bias power supply 109 was set to. 60 W, the frequency was set to 800 kHz, the on-off frequency was set to 1 kHz, the gas was made up of chlorine (185 sccm) and oxygen (15 sccm), and the pressure was 0.8 Pa. Although the rf bias power is a parameter, in the on-off bias modulation, the power was controlled by setting the peak power to 60 W and varying the duty ratio. To be specific, when the duty ratio is 50%, the power is 30 W (50% of 60 W).

As understood from FIG. 8, with respect to the on-off bias modulation, the selectivity increases in a region where the duty ratio is 50% or lower as compared with the continuous wave bias. Even if the ion energy is increased, the degree of anisotropy can be increased without decreasing the etch selectivity. The lower the duty ratio is, the larger the effects are. When the duty ratio is too low, however, the polysilicon etch rate becomes low. In practice, consequently, it is preferable to set the duty ratio within a range from 5% to 50%.

The reason why the above-described effects can be obtained by on-off modulation of the rf bias, that is, time modulation, will be described hereinbelow.

It is considered that the reason why the selectivity is increased by the on-off bias modulation is that reaction products are deposited on the oxide film during the off period of the rf bias, thereby reducing the etch rate of the oxide film. Especially, the reaction products of chlorine, oxygen, and silicon tend to be deposited on the oxide film in the region where the temperature is low. Since the energy of ions impinging on the surface of the sample is low during the rf bias off period, the surface temperature also becomes low. The reaction products are deposited on the oxide film during the off period, and the selectivity is higher as compared with that of the continuous wave bias at the same Vpp and that of the continuous wave bias with the parameter of Vpp at which the same etch rate can be obtained. In the on-off bias modulation as well, when the ion energy is made higher than the amplitude Vpp of the continuous bias case, the etch rate of the oxide film increases and the same selectivity as that in the case of using the continuous wave bias is obtained. Since the ion energy is high in the region, however, as shown in the embodiment of FIG. 5, a highly anisotropic etching without any microtrench can be realized. Generally, the higher the ion energy is, the more the aspect ratio dependence is reduced. Consequently, by the on-off bias modulation, the aspect ratio dependence also can be reduced without decreasing the selectivity.

Figure 9:
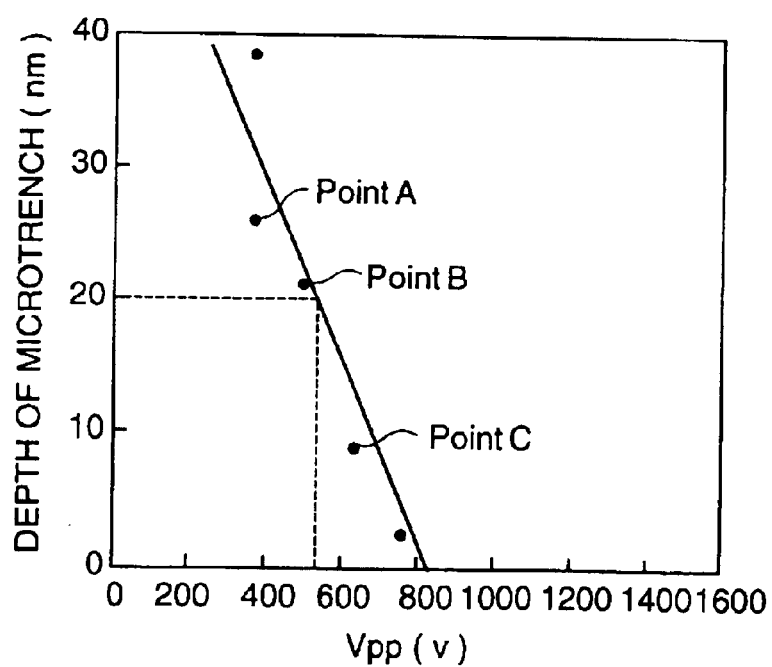
FIG. 9 is a graph showing the relation between an amplitude of an rf bias voltage and the depth of a microtrench.

Parameters of the ion energy to increase the degree of anisotropy and reduce the microtrench will now be described. FIG. 9 shows the relation between the rf bias voltage and the depth of the microtrench as obtained by experiments. In this case, the depth of the microtrench denotes the depth of the fine trench 509 formed on the trench bottom of polysilicon, expressed by "L" in FIG. 7. The depth of the microtrench permitted by the formation of a gate of a transistor will be obtained hereinbelow. In the formation of the gate, it is necessary to perform the etching so that there is no etch residue of polysilicon on the bottom of the trench while a sufficient amount of the gate oxide film 502 is left. In a thin region where the thickness of the gate oxide film is 6 nm or smaller, the thickness of the gate oxide film after the etching has to be 2 nm or larger. If the polysilicon film corresponding to the depth L of the microtrench cannot be etched within a time in which the thickness of the gate oxide film becomes 2 nm or larger, the etch residue of polysilicon occurs on the trench bottom.

When the amount of the polysilicon which can be etched until the remainder of the gate oxide film becomes 2 nm is set to a permissible microtrench depth Lmax(nm), Lmax= S(d-2), where S denotes the selectivity between polysilicon and the oxide film and d(nm) indicates the initial film thickness of the gate oxide film. The relation is shown in FIG. 10.

Figure 10:
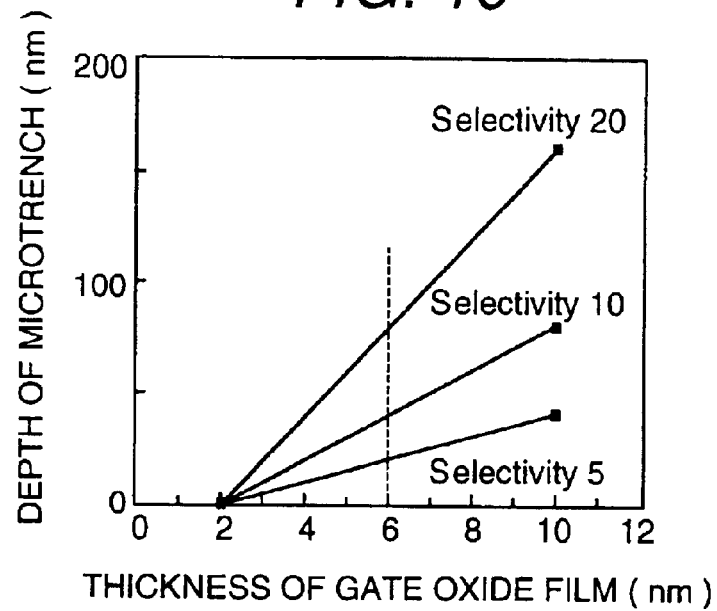
FIG. 10 is a graph showing the relation between the thickness of a gate oxide film and the permissible depth of a microtrench.
Figure 11:
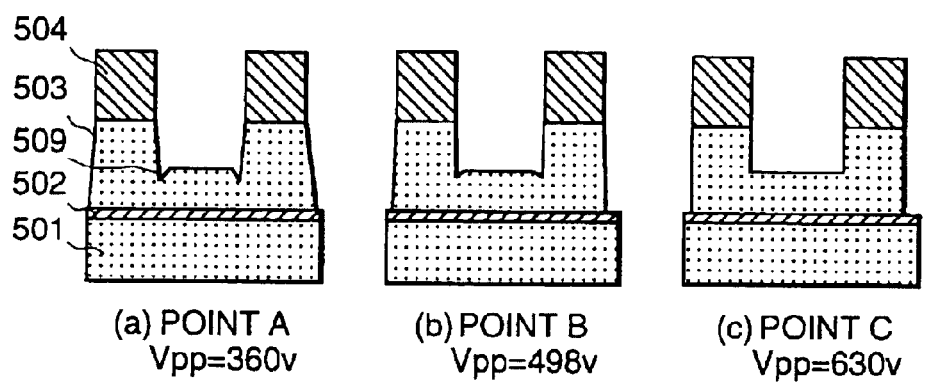
FIGS. 11(a) to 11(c) are cross sections of a sample at the time of etching.

Further, etch profiles at points A, B, and C in FIG. 9 are shown in FIG. 11. From FIGS. 9 to 11, the ion energy which can satisfy both the anisotropy and the gate oxide film residue amount is obtained. First, with respect to the verticality of the etched sidewall, when the amplitude Vpp is 500V or higher, the verticality reaches a sufficient level in a device having a minimum feature size of 1 µm to 0.1 µm. When Vpp is 500V to 1000V, in the above-described etching process using the continuous wave bias on a mixed gas of chlorine and oxygen, the etch selectivity lies within a range from 10 to 5.

It will be understood from FIG. 10 that, for example, in case of processing a gate oxide film of 6 nm, the permissible microtrench depth at the etch selectivity of 5 is about 20 nm. It will be understood from FIG. 9 that the process can be performed from a calculation viewpoint when Vpp is set to 500V or higher since the microtrench depth becomes 20 nm or smaller in a region where Vpp is 500V or higher. When the selectivity is 10 or lower, however, if the etching is not stopped accurately at the endpoint of the etching, the gate oxide film is etched because there is no allowance. A method of increasing the selectivity while maintaining Vpp at 500V is therefore required, that is, the cooperation of the on-off bias is necessary.

A physical quantity which directly exerts an influence on the depth of the microtrench and the selectivity does not relate to the amplitude of Vpp, but relates to the ion energy. Since it is difficult to measure the ion energy in practice, the amplitude of Vpp is used as an index of the ion energy. The relation between the ion energy and the rf voltage will now be described. When the rf voltage is applied to the stage via a plasma, a DC potential (hereinbelow, referred to as "Vdc") is so generated as to attract ions into the stage by causing a current to flow between the earth (generally, a conductive wall serves as the earth) and the electrode. The ions are accelerated by an electric field obtained by overlapping Vdc and the rf voltage which changes with time. The maximum ion energy which can be obtained varies depending on whether the motion of the ions follows the change with time of the rf voltage. Generally, the density of a plasma used for etching is equal to or higher than $1 \times 10^{10}/cm^{-3}$. With such a density, the ions travel through the plasma sheath and reach the sample during the period in which the rf voltage is negative, that is, during a period of ½ of the sine wave when the rf bias frequency is 15 MHz or lower. Emax is therefore almost equal to a value obtained by adding Vdc to the value of ½ of the voltage amplitude (Vpp/2). In reality, there is a voltage drop or the like in an electric circuit. It is known from measurement that Emax is 400 eV when Vpp is 500V. Since a substantial physical quantity which exerts an influence on the etch profile is not Vpp but the ion energy, in order to obtain a profile without any microtrench, it is sufficient to set the maximum value of the ion energy to 400 eV or higher. When the frequency of the rf bias increases and the motion of the ions does not follow the change in voltage, Emax gradually approaches Vdc. A period during which the frequency is from 15 MHz to a few tens of MHz is a transient period. In such a case as well, if Vpp is set to 800V or higher, Emax sufficiently becomes 400 eV or higher.

Although the required amplitude of Vpp varies according to the structure of a device and the etching gas, the amplitude of 500V or higher is a reference. When the underlying film is thick and the occurrence of the microtrench does not exert any influence or, as will be described hereinlater, when the etching is divided into some steps and the invention is applied to an over etch after completion of a main etch, the amplitude Vpp can be set to a lower value. In this case, about 100V is sufficient.

Figure 12:
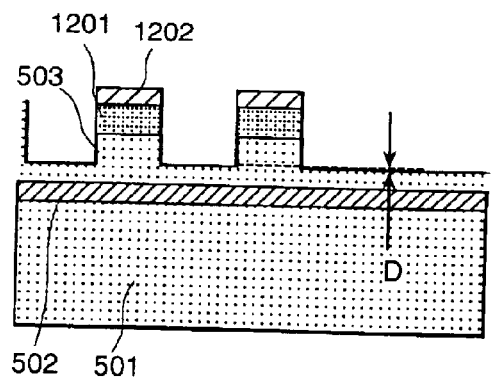
FIG. 12 is a cross section of a sample at the time of treatment in accordance with the invention.

A third embodiment, in which the invention is applied to etching performed on another material, and the result thereof will be described. As shown in FIG. 12, a sample is formed in such a manner that 4 nm of an oxide film 502 is deposited on a silicon substrate 501, and then 300 nm of a polysilicon film 503, 80 nm of a tungsten silicide (WSi) film 1201, and an uppermost layer of a silicon nitride film 1202 patterned as a mask are sequentially deposited thereon. As an etching gas, a mixed gas of chlorine (185 sccm) and oxygen (15 sccm) was used. The pressure of the etching gas was set to 0.8 Pa. The output power of the microwave energy generated from the magnetron 101 was set to 400 W. The frequency of the rf bias power supply 109 was set to 800 kHz.

Figure 13:
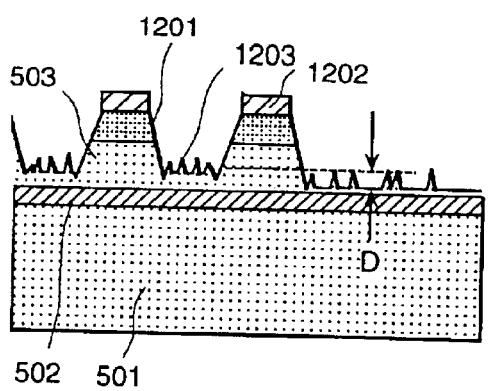
FIG. 13 is a cross section of a sample at the time of treatment in a comparative example.

FIG. 13 shows an etch profile of a comparative example in which the continuous wave bias was set to 60 W. FIG. 12 shows an etch profile when the peak output of the on-off bias was set to 300 W and the duty ratio was set to 20%. In the samples as well, when etching was performed with the continuous wave bias, the verticality was low and the aspect ratio dependency was large. On the other hand, when using the on off bias method of the invention, the verticality of the sidewalls is improved. Further, in the sample shown in FIG. 13, whiskers 1203 are shown on the etched surface of the polysilicon. It is assumed that the whiskers 1203 are formed due to a micro mask on the interface between the polysilicon film 503 and the WSi film 1201. The whiskers 1203 cause an etch residue. The on-off bias method can reduce the density of the whiskers as well.

Figure 14:
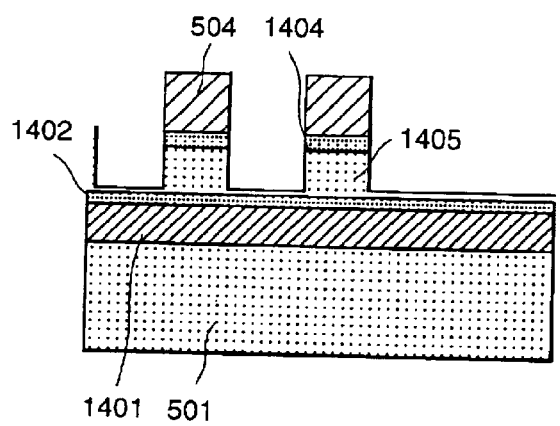
FIG. 14 is a cross section of a sample at the time of treatment in accordance with the invention.

A fourth embodiment, in which the invention is applied to etching performed on a metal, such as aluminum, and its result will be described. The structure of a sample is as shown in FIG. 14. In the processing, 300 nm of an oxide film 1401, 100 nm of a TiN film 1402, 400 nm of Al film 1403, and 75 nm of a TiN film 1404 are sequentially deposited on the Si substrate 501. Then, 1 $\mu$m of a resist mask 504 is formed as an uppermost layer. The dimension of each of a line and a space was 0.4 $\mu$m. As the etching gas, a mixed gas of chlorine (80 sccm) and $BCl_3$ (20 sccm) was used and the pressure was set to 1 Pa. The output power of the microwave energy generated by the power supply 101 was set to 700 W, the stage temperature was set to 40° C., the frequency of the rf bias power supply 109 was set to 400 kHz, and the on-off frequency was set to 2 kHz.

Figure 15:
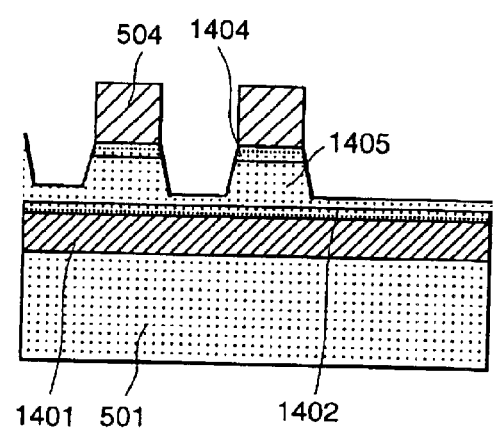
FIG. 15 is a cross section of a sample at the time of treatment in a comparative example.

FIG. 14 shows an etch profile when the peak power of the on-off bias modulation was 350 W and the duty ratio was 20%. FIG. 15 shows an etch profile of a comparative example when the power of the continuous wave bias was set to 70 W. With such values of power, the etch rates of aluminum are substantially equal. In the sample shown in FIG. 15, the aspect ratio dependency is large, and the verticality of the sidewall 1405 facing a wider space, when the continuous wave bias is used, especially deteriorates. The aspect ratio dependence is, however, suppressed by using the on-off bias modulation. That is, in the case of a metal as well, the higher the ion energy is, the more the degree of anisotropy or the aspect ratio dependence is improved. Since the ion energy can be set to be high without decreasing the selectivity between the metal and the underlying oxide film by using the on-off bias modulation, the above effects are produced.

As a method of further utilizing the effects of the invention, there is a method of dividing the etch process into a plurality of steps. The method will be described as a fifth embodiment. FIGS. 16(a) to 16(d) show a change with time in the etch profile when a sample as a substance to be treated is processed in steps. A sample is formed in such a manner that 4 nm of an oxide film 502 is deposited on a silicon substrate 501, and then 200 nm of polysilicon 503 and 200 nm of a silicon nitride film 1801 are sequentially deposited. The silicon nitride film is processed in a desired pattern. The interval between a line and a space is 250 nm. A native oxide film 1802 is usually formed on the surface of the polysilicon 503.

Figure 16:
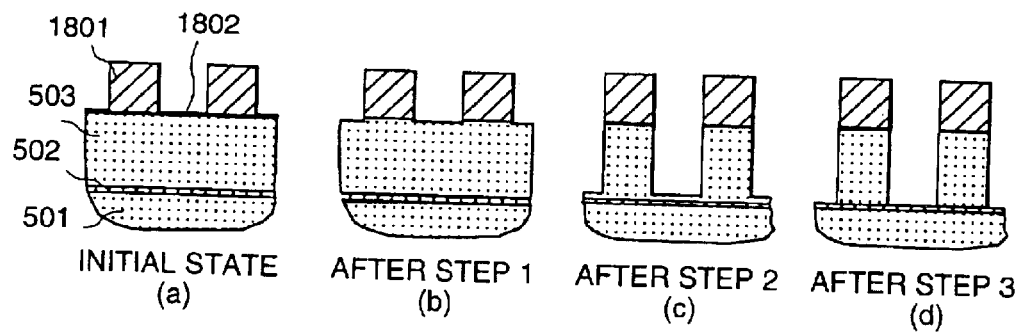
FIGS. 16(a) to 16(d) are cross sections of a sample processed in an etcher according to another embodiment of the invention.

The sample having this structure is etched in three steps. FIG. 16(a) illustrates an initial state. In step 1, the native oxide film 1802 is eliminated. $Cl_2$ (200 sccm) was used as an etching gas and the pressure was set to 0.8 Pa. The output power of the microwave power energy generated by the supply 101 was set to 400 W. The frequency of the rf bias power supply 109 was 800 kHz. Since the step 1 aims at eliminating the thin native oxide film, the processing time was set to five seconds and the continuous output of the rf power supply 109 was set to 60 W. The profile of the sample after completion of step 1 is shown in FIG. 16(b).

Step 2 relates to etching of the polysilicon 503 as a main part of the process. The etching will be referred to as a "main etch" hereinbelow. Since the profile control in this step is the most important, the rf bias power supply 109 is on-off modulated in step 2, the power was set to 200 W and the duty ratio was set to 30%. The amplitude of Vpp was 1000V. As an etching gas, a mixed gas of chlorine (185 sccm) and oxygen (15 sccm) was used and the pressure was set to 0.8 Pa. The other parameters were the same as those in step 1. With the parameters, the etch rate of the polysilicon was 300 nm/min. and the selectivity of the polysilicon and the oxide film was 20. The etching time was set to 35 seconds. The profile after completion of step 2 is shown in FIG. 16(c). Side faces perpendicular to the flat bottom surface without any microtrench can be obtained. The time in step 2 was set so as to leave a small amount of the polysilicon 503.

In the last step 3, since the thin underlying oxide film 502 is exposed, the parameters are changed so that the selectivity is high even if the etch rate of the polysilicon is lowered. Specifically, the continuous power of the rf bias power supply 109 was set to 30 W. The other parameters were the same as those in step 2. With these parameters, the etch rate of the polysilicon becomes 100 nm/min. and the selectivity is 50. Etching having a relatively high selectivity after completion of the main etching is called an over etch. The etch time was set to 30 seconds. The profile after completion of step 3 is shown in FIG. 16(d). By raising the selectivity, the process can be performed while the underlying oxide film is sufficiently left without a etch residue of the polysilicon 503. Although the continuous wave bias was used in step 3, the peak power can be reduced in the on-off bias modulation.

As described above, by applying the on-off bias modulation to the processing of the main part of the sample as a substance to be etched, a desired processing can be performed without damaging the very thin underlying film.

Even if a substance to be etched has a multilayer structure made up of various substances, a high-precision process causing no shape deformation can be carried out by increasing the number of steps. To which step the on-off bias modulation is applied will be properly determined according to the device structure. Parameters having a wider process margin can be set by using the on-off bias modulation. Although the etching gas is continuously supplied in the embodiment, when the etching is divided into plural steps, the supply of the gas does not have to be continuous among the steps.

The structures of plasma etchers to which the invention can be applied will be described. Since the invention aims to process, a device whose minimum feature size is 1 $\mu$m, preferably, 0.5 $\mu$m or smaller, the effects are displayed when the invention is applied to a machine of a so-called high-density type in which the plasma electron density is $1 \times 10^{10}/cm^{-3}$ or higher, preferably, $1 \times 10^{11}/cm^{-1}$ or higher. As plasma etchers of this type, there are an inductively coupled plasma etcher and an ECR etcher. A capacitively coupled plasma etcher, which has been known for a long time, has problems as described below and is not adapted to the invention. Since such an etcher cannot generate a high density plasma, the throughput is low. Since the plasma density is low, the sheath becomes thick and the ions are scattered in the sheath, thereby deteriorating the degree of anisotropy. Since the plasma cannot be generated in a region where the gas pressure is low, the ions scatter considerably.

Figure 17:
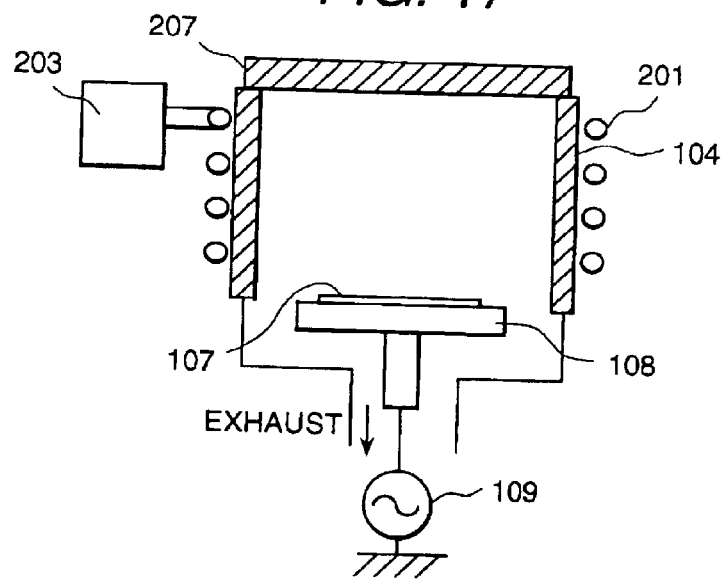
FIG. 17 is a schematic diagram of an etcher according to another embodiment of the invention.

FIG. 17 shows an inductively coupled plasma etcher representing a sixth embodiment of the invention. This etcher generates a plasma by inductive coupling using electromagnetic waves having a so-called rf frequency of a few hundreds of kHz to tens of MHz. The chamber 104 is made of a substance, such as alumina or quartz, which transmits electromagnetic waves. A coil antenna 201 for generating a plasma is wound around the chamber 104. An rf power supply 203 is connected to the coil antenna 201. In the chamber, a stage 108 is provided, a sample 107 is placed on the stage 108, and an rf bias power supply 109 is connected to the stage 108. The chamber 104 has an upper lid 207. The chamber 104 and the upper lid 207 also can be formed integrally.

In an etcher of this kind, as well, in a manner similar to the foregoing embodiments, the above-mentioned effects can be produced by on-off modulating the rf bias power supply 109. In the etcher shown in FIG. 17, when the coil antenna 201 is mounted on the upper lid 207, the same effects can be produced.

Figure 18:
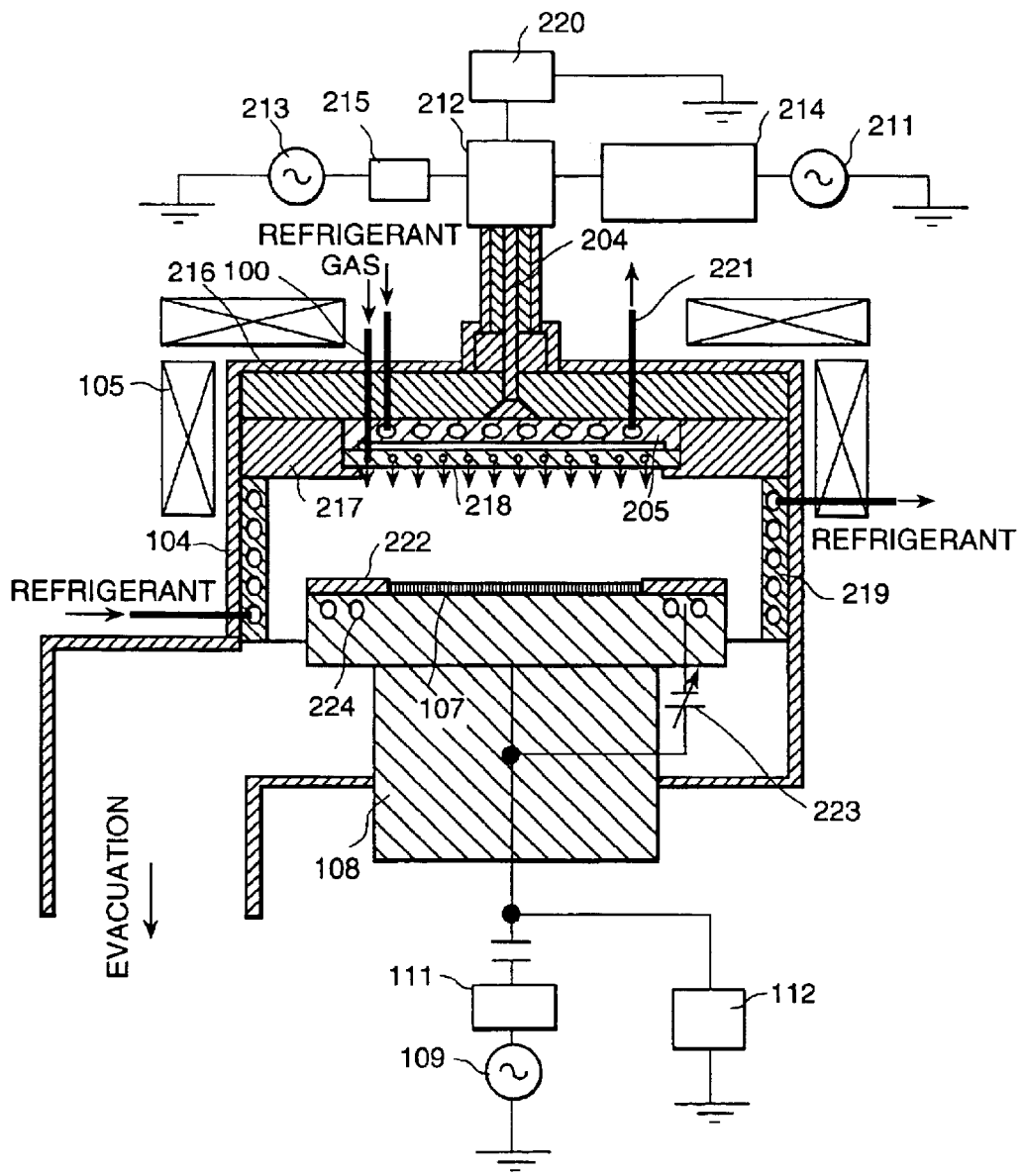
FIG. 18 is a cross section of the overall configuration of another embodiment of the invention.

Further, as a seventh embodiment of the invention, an etcher having a structure for producing electron cyclotron resonance (ECR) between the electromagnetic wave and the magnetic field will be described with reference to FIG. 18.

Coils 105 are arranged around a chamber 104 having a gas introducing passage 100. A plasma is obtained from a gas introduced into the chamber 104 by a mutual action of the electromagnetic waves introduced to an antenna plate 205 through a coaxial cable 204 and the magnetic field generated by the coils 105. A sample 107 is treated with the plasma. The sample 107 is placed on a stage 108 and is supported by electrostatic chucking. An rf bias for attracting ions to the sample 107 is applied from an rf bias power supply 109 via a matching apparatus 111 to the stage 108. A voltage for electrostatic chucking is applied to the stage 108 from a DC power supply 112. A 450 MHz power supply 211 for plasma generation and a 13.56 MHz power supply 213 for antenna bias are connected to the antenna plate 205 via a filter 212, so that two different frequencies are applied to the antenna plate 205. The power supplies are connected to the filter 212 via matching apparatuses 214 and 215, respectively. The coaxial cable 204 and the antenna plate 205 are connected via a member of an almost conical shape, so that the high frequencies propagated via the coaxial cable 204 are efficiently transmitted to the antenna plate 205. Reference numeral 219 denotes a temperature controlling inner wall means provided on the inside of the chamber 104; 227 denotes an annular member provided for the stage 108 and arranged on the outer peripheral part of the sample 107; 223 denotes a power supply connected to the annular member 227 for controlling plasma distribution; 224 denotes a passage through which a heating medium for controlling the temperature of the stage 108 flows; and 220 denotes a filter for an antenna bias, which will be described hereinlater, provided between the coaxial cable 204 and the ground potential.

In the etcher, when electromagnetic waves (microwaves) of 450 MHz for plasma generation are supplied to the antenna plate 205, the antenna plate 205 operates as a plane antenna. The ceiling (opposite to a plasma generating region) of the chamber 104 above the antenna plate 205 and the antenna plate 205 face each other and the ceiling is connected to earth potential. Between the ceiling and the antenna plate 205, a dielectric member 216 made of quartz, alumina, or the like is disposed. The diameter of the antenna plate 205, the material and thickness of the dielectric, and the like are determined so that the electromagnetic waves of 450 MHz resonate in a $TM_{01}$ mode between the ceiling and the antenna plate 205. The 450 MHz electromagnetic waves, which are resonated by the plane antenna structure, pass through the dielectric member 216 and a ring made of a dielectric material (called a quartz ring 217 since quartz is used here) arranged around the antenna plate 205 and are emitted into the plasma. A part of the electromagnetic waves propagates as a surface current on the surface of the antenna plate 205 and is emitted from a part contacting the plasma. In this manner, the electromagnetic waves of 450 MHz supplied to the antenna plate 205 are efficiently supplied via the dielectric member 216 and the quartz ring 217 to the outer peripheral space in the chamber 104 and are resonated with the magnetic field generated by the coils 105. Consequently, the plasma can be easily generated and maintained.

The antenna plate 205 operates as a plane antenna plate and, according to the embodiment, the electromagnetic waves and the magnetic field are electron cyclotron resonated. The magnetic field in this case has to be strong enough to bring about the electron cyclotron resonance with the electromagnetic waves of 450 MHz and is 100 to 200 gauss. A magnetic field having such strength is generated by the coil 105. Since the electromagnetic waves can be efficiently supplied from the antenna plate even in a state where there is no magnetic field, the plasma can be generated. Therefore, the etcher of this embodiment is not limited to the case where a magnetic field is used.

The quartz ring 217 is arranged around the antenna plate 205. The quartz ring 217 has the effect of suppressing any tendency for the magnetic field around the antenna plate 205 or the plate 218 made of silicon for supplying an etching gas to become locally strong, so that the plasma can be generated uniformly.

In the case of using the electron cyclotron resonance with the magnetic field, the uniformity of the plasma and the magnetic field parameters have a close relation. An electron cyclotron resonance region can be set at an arbitrary position by the coils 105 provided around the chamber 104. According to this embodiment, since electromagnetic waves of 450 MHz are used, the resonance region is a region where the magnetic field of about 160 to 180 gauss is generated. Since a plasma is efficiently generated in this resonance region, the plasma density is high. The resonance region is, however, largely influenced by the magnetic field parameters. By regulating the position of the electron cyclotron region, the magnetic field gradient (rate of change in the magnetic field strength), the shape of the resonance region, and the like so that the plasma density in the etching region is uniformized, a setting adapted to each etching can be made.

The etcher of this type can also improve the verticality of the sidewall by on-off modulating the rf bias power supply 109 as described in the foregoing embodiment. The essence of the etcher of FIG. 18 is that the frequency band of the power supply 211 for plasma generation corresponds to the electromagnetic waves in the microwave region of so-called VHF to UHF bands from 100 MHz to 1 GHz. Additional functions which will be described hereinbelow are not always necessary. The power supply 213 for antenna bias of 13.56 MHz connected to the antenna plate 205 is to control chemical species in the plasma by applying a bias to the antenna plate 205 and is not always necessary. The circular member 222 around the stage 108 is provided to control the uniformity of the plasma and is not always necessary. A structure in which the antenna plate 205 is disposed outside of the chamber also can be employed.

An eighth embodiment of the invention characterized by a sample attracting method will now be described. As mentioned above, in accordance with the invention, in order to perform high-accuracy etching by on-off modulating the rf bias voltage at high speed, the rf bias has to be applied uniformly to the sample without causing distortion of the waveform or the like. It is therefore necessary to attract the sample to the stage without a large gap. If there is a gap, a non-uniformity occurs in the application of the rf bias according to the electric capacity. In the on-off bias modulation, therefore, as shown in FIG. 1, the combination with the electrostatic chuck type stage is important. Since the rf bias is on-off modulated, there is the possibility that a fluctuation occurs in the electrostatic attraction. It is therefore preferable to employ such biasing with a dipole type electrostatic chuck, which will be described hereinbelow.

Figure 19:
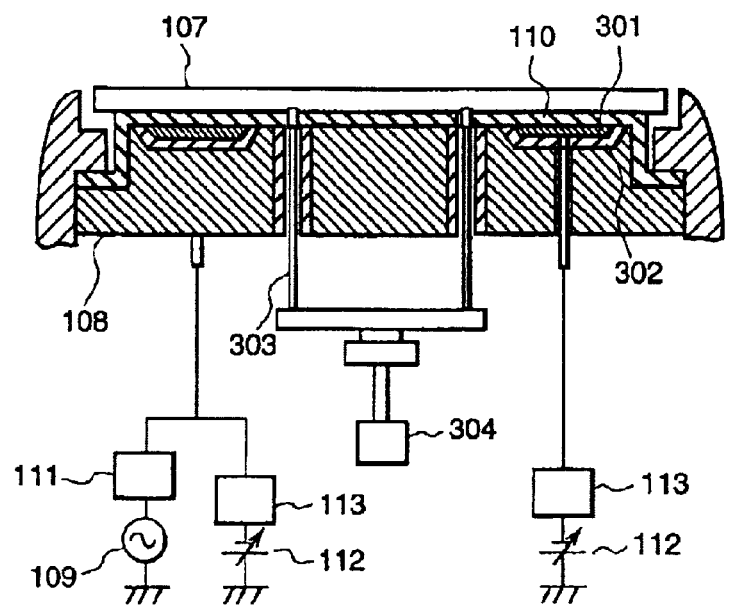
FIG. 19 is an enlarged cross section of a stage in an etcher according to another embodiment of the invention.

FIG. 19 is an enlarged diagram of the stage part of the etcher described above, having a dipole type electrostatic chuck structure. The stage 108 has a second electrode 301 serving as an electrode for electrostatic chucking surrounded by an insulating part 302. A DC voltage is applied to the stage 108 via a low pass filter 113. The sample 107 can be lowered onto and lifted from the stage 108 by a pusher 303 and a lifting mechanism 304. A stage having a monopole type electrostatic chuck apparatus as shown in FIG. 1 cannot attract the sample when the plasma is not generated. The dipole type stage of the present embodiment can attract the sample without a plasma by applying a voltage of a different polarity to the stage 108 and the second electrode 301. Therefore, the sample can be attracted without being influenced by the on-off states of the rf bias, so that the stability of the sample is excellent.

Figure 20:
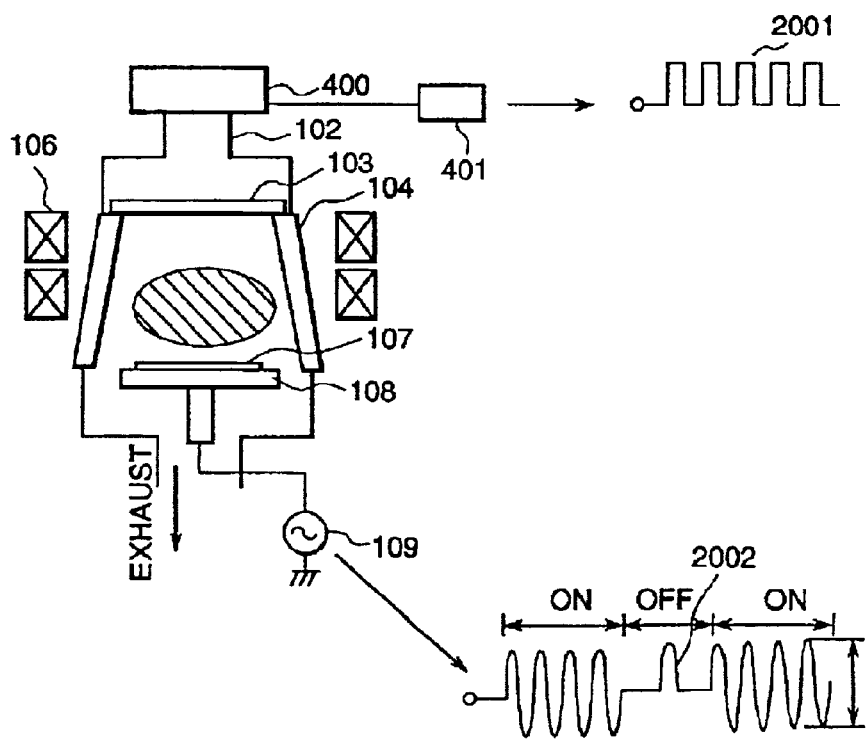
FIG. 20 is a schematic diagram of an etcher according to another embodiment of the invention.

FIG. 20 shows a ninth embodiment of the invention. In an etcher, the microwaves supplied from the magnetron for generating a plasma are also on-off modulated. In this structure, a pulse modulator 401 is connected to the microwave power supply 101 and the plasma is on-off modulated by pulse waves 2001. By on-off modulation of the plasma, the electron temperature decreases. Consequently, the possibility of damage to the sample by charged particles can be reduced. A positive pulse 2002 also can be overlapped on the rf bias power supply 109 in the OFF period. By such operation, electrons are attracted to the fine pattern on the surface of the sample, thereby enabling possible damage caused by charging to be suppressed.

As a tenth embodiment, other parameters of the etching will be explained. The parameters described in the foregoing embodiments are typical values. Even when the pressure of the etching gas, the kind of etching gas being used, the value of the power used for plasma generation, and the like are changed, the on-off bias modulation in accordance with the invention is effective. When the etch rate and the selectivity are taken into account, however, an application within the following range is desirable. With respect to the mixed gas of chlorine and oxygen used for etching mainly polysilicon and a multilayer including polysilicon, 0% to 50% of the mixing ratio of oxygen is proper when the flow of chlorine is 20 sccm to 1000 sccm. When the mixing amount of oxygen becomes larger than that, the etch rate of polysilicon becomes extremely low. In addition, 0.1 Pa to 10 Pa is proper for the pressure. In case of using a mixed gas of chlorine, HBr, and oxygen as an etching gas, when the flow of each of chlorine and HBr is 20 sccm to 1000 sccm, a proper mixing ratio of oxygen is 0% to 50%.

For the etching of a metal conductive line made of Al or the like, chlorine, a mixed gas of chlorine and $BCl_3$, a mixed gas of chlorine and HCl, and a mixed gas of chlorine, $BCl_3$, and HCl are suitable. In this case, at a flow rate of each of chlorine and HCl of 20 sccm to 1000 sccm, a proper mixing ratio of $BCl_3$ is 0% to 50%. Further, a rare gas such as $CH_4$ or argon also can be mixed with each of the gasses.

The density of the plasma is determined by the power of the power supply for plasma generation and has a close relation with the etch rate. In order to obtain a practical rate, the power for the volume of a plasma generating space, that is, a space between the stage and the electrode, is set to 0.01 W/cc or larger. When the plasma density is too high, a problem such as electric damage to the device occurs. It is therefore preferable to set the power to 0.2 W/cc or smaller.

The frequency of the bias power supply to be applied to the sample is preferably 100 kHz to 100 MHz. Although the band of the ion energy can be narrowed with respect to a frequency higher than that, a problem occurs in that a plasma is easily generated by the bias power supply. When the on-off frequency is 100 Hz or lower, the on/off time is too long and an etched sidewall becomes unsmooth. When the on-off frequency is high, it is technically difficult to produce sufficient power. Consequently, a frequency lower than or equal to 10 kHz is suitable.

The invention produces a special effect on both the processing of a fine pattern in which an interval between a line and a space is 0.5 μm or smaller, and the processing of a sample in which the thickness of an underlying oxide film is 6 nm or smaller in a gate electrode.

According to the invention as described above, there are the following features.

By on-off modulating the rf bias voltage, which has a Vpp value larger than the Vpp value of a continuous rf bias voltage at which the same etch rate can be obtained, the degree of anisotropy can be improved without deteriorating the selectivity.

By setting the frequency of the rf bias voltage to 15 MHz or lower and setting the Vpp value of the rf bias voltage to 500V or higher, the microtrench is reduced and the degree of anisotropy can be raised.

When the frequency of the rf bias voltage is higher than 15 MHz, by setting the Vpp value of the rf bias voltage to 800V or higher, the microtrench is reduced, and the degree of anisotropy can be increased.

By setting the duty when the rf bias voltage is "ON" to 5 to 50%, the effect of the improved selectivity can be made more conspicuous.

The sample surface treatment from the beginning to the end is divided into a plurality of steps and the rf bias voltage is on-off modulated in at least one of the steps, thereby enabling a region having high selectivity or a region having high anisotropy to be properly used. Thus, the processing accuracy can be further raised.

The plurality of steps are divided into a first half in which the etch rate of the underlying substance is relatively low and a latter half in which the etch rate is relatively high. By on-off modulating the rf bias voltage at least in the steps of the first half, the region in which the anisotropy is high can be effectively used in the on-off modulation and the etch profile can be improved.

The steps are switched according to time, thereby enabling etching of a complicated multilayer to be accurately performed by a simple switching control.

Independent of the plasma generation, the rf bias having a frequency of 100 kHz or higher is applied to the sample, and the rf bias is modulated at a frequency of 100 Hz to 10 kHz. In this manner, a surface treatment in which the minimum feature size is 1 μm or smaller is performed on the sample. Consequently, the ion energy band is narrowed, the effect of the on-off bias can be produced more effectively, and a finer etch can be carried out.

By using a high density plasma having an electron density of the plasma of $1\times10^{10}/cm^{-3}$ or higher, an etching having a high throughput can be carried out.

An etching having a higher selectivity between polysilicon and the oxide film can be performed by using a mixed gas of chlorine and oxygen as an etching gas.

The surface of a sample is treated in such a manner that a plasma is generated from the etching gas by using microwaves, independently of the plasma generation. An rf bias having a frequency of 100 kHz to 10 MHz is applied to the stage, the rf bias is on-off modulated at a frequency of 100 Hz to 10 kHz, and the Vpp value of the rf bias voltage at the time of "ON" is set to 100V or higher, thereby enabling an etching having a high selectivity to be performed with high throughput.

By employing an ECR plasma using microwaves of 2.45 GHz as the plasma, a magnetron can be used as a power supply. Thus, the above-described effects can be obtained while keeping the price of the etcher low.

By employing an ECR plasma using microwaves of 100 MHz to 1 GHz as the plasma, since the wavelength of the microwaves is long, the above-mentioned effects can be obtained by using a uniform plasma having a larger diameter.

The sample having a pattern whose minimum feature size is 1 Mm or smaller is held by electrostatic chucking, and the sample is treated with a plasma by time modulating the rf bias to be applied to the sample independently of the plasma generation. Consequently, the on-off modulated rf bias is uniformly and efficiently transmitted to the sample. Thus, a sample having a fine pattern can be treated with high accuracy and high reliability.

By holding the sample by an electrostatic chuck of the dipole type, some attraction can be obtained irrespective of the on/off states of the rf bias, so that the reliability of the work is improved.

A sample having a film made of a material which serves as a gate electrode on the gate oxide film having a thickness of 6 nm or smaller is subjected to the plasma treatment by time modulating the rf bias applied independently of the plasma generation, thereby enabling the upper layer to be etched while sufficiently leaving a thin oxide film.

By applying the on-off modulation of the rf bias to a sample having a polysilicon film as a film serving as a gate electrode or having a multilayer including a polysilicon film, a highly anisotropic etching can be performed.

With respect to the on-off modulation of the rf bias in the foregoing embodiments, the stopping of the application of the rf bias voltage in the rf bias off period, the setting of the output of the rf bias voltage to 0V, and the application of a voltage small enough to exert no influence on the effects of the rf bias off period are included in the on-off modulation according to the rf bias voltage or time modulation of the present invention.

What is claimed is:

1. A method of treating a surface of a sample having a film formed on a thin underlying film, which film is etched as a main part of etching, comprising the steps of:

generating a plasma in a treatment chamber;

applying an rf bias voltage of a frequency of at least 100 kHz so that ions of intermediate energy which promote etching reaction while providing poor directionality are reduced, and ions of high energy having a high directionality and ions of low energy which do not contribute to etching are increased, so as to have at least one peak point at a region of high ion energy and at least one peak point at a region of low ion energy for anisotropic etching, and the rf bias voltage to which a peak to peak voltage Vpp value larger than a Vpp value of a continuous rf bias voltage at which the same etch rate can be obtained is given, so as to have the high ion energy which is larger than a high ion energy of the continuous rf bias voltage, is applied to a stage on which a sample is placed independently of the generation of the plasma; and on-off modulating the rf bias voltage by effecting modulation of the rf bias voltage for one period of anisotropic etching treatment of the sample which is prior to another period of etching treatment of the surface of the sample in which selectivity is higher than selectivity at the one period and in which modulation of the rf bias voltage is not effected, wherein said one period of anisotropic etching treatment in which the modulation of the rf bias voltage is effected is applied to said film as a main part of etching, and said another period of etching treatment in which the modulation of the rf bias voltage is not effected and having a higher selectivity than the selectivity in said one period is applied to a small amount of said film which remains before said thin underlying film is exposed.

2. A method according to claim 1, wherein the modulation of the rf bias voltage in the on-off modulating is effected at a frequency of at least 100 Hz.

3. A method of treating a surface of a sample having a film formed on a thin underlying film, which film is etched as a main part of etching, comprising the steps of:

generating a plasma in a treatment chamber;

applying an rf bias voltage of a frequency so that ions of intermediate energy which promote etching reaction while providing poor directionality are reduced, and ions of high energy having a high directionality and ions of low energy which do not contribute to etching are increased, so as to have at least one peak point at a region of high ion energy and at least one peak point at a region of low ion energy for anisotropic etching, and the rf bias voltage to which a peak to peak voltage Vpp value larger than a Vpp value of a continuous rf bias voltage at which the same etch rate can be obtained is given, so as to have the high ion energy which is larger than a high ion energy of the continuous rf bias voltage, is applied to a stage on which a sample is placed independently of the generation of the plasma; and on-off modulating the rf bias voltage by effecting modulation of the rf bias voltage for one period of anisotropic etching treatment of a surface of the sample which is prior to another period of etching treatment of the surface of the sample in which selectivity is higher than selectivity at the one period and in which modulation of the rf bias voltage is not effected, wherein said one period of anisotropic etching treatment in which the modulation of the rf bias voltage is effected is applied to said film as a main part of etching, and said another period of etching treatment in which the modulation of the rf bias voltage is not effected and having a higher selectivity than the selectivity in said one period is applied to a small amount of said film which remains before said thin underlying film is exposed;

wherein a duty ratio of the on-off modulation of the rf bias voltage is set to 5 to 50%.

4. A method according to claim 3, wherein the applying of the rf bias voltage is effected at frequency of at least 100 kHz and the modulation of the rf bias voltage in the on-off modulating is effected at a frequency of at least 100 Hz.

5. A method of treating a surface of a sample, comprising the steps of:

generating a plasma in a treatment chamber;

applying an rf bias voltage of a frequency so that ions of intermediate energy which promote etching reaction while providing poor directionality are reduced, and ions of high energy having a high directionality and ions of low energy which do not contribute to etching are increased, so as to have at least one peak point at a region of high ion energy and at least one peak point at a region of low ion energy for anisotropic etching, and the rf bias voltage to which a peak to peak voltage Vpp value larger than a Vpp value of a continuous rf bias voltage at which the same etch rate can be obtained is given, so as to have the high ion energy which is larger than a high ion energy of the continuous rf bias voltage, is applied to a stage on which a sample is placed independently of the generation of the plasma; and on-off modulating the rf bias voltage by effecting modulation of the rf bias voltage for one period of an anisotropic main etch of a first layer of the sample which is prior to another period during which a second thin layer which underlies the first layer is exposed and in which selectivity is higher than selectivity at the one period and in which modulation of the rf bias voltage is not effected, wherein said one period of anisotropic etching treatment in which the modulation of the rf bias voltage is effected is applied to said first layer as a main part of etching, and said another period of etching treatment in which the modulation of the rf bias voltage is not effected and having a higher selectivity than the selectivity in said one period is applied to a small amount of said first layer which remains before said underlying second thin layer is exposed;

wherein the at least one peak point of the region of the high ion energy and the at least one peak point of the region of the low ion energy has a number of ions which is at least twice a number of ions in a region of the intermediate ion energy.

6. A method according to claim 5, wherein the applying of the rf bias voltage is effected at frequency of at least 100 kHz and the modulation of the rf bias voltage in the on-off modulating is effected at a frequency of at least 100 Hz.

\* \* \* \* \*